United States Patent
Tsubaki et al.

(10) Patent No.: US 7,572,659 B2
(45) Date of Patent: Aug. 11, 2009

(54) SEMICONDUCTOR DYNAMIC SENSOR AND METHOD OF MANUFACTURING THE SAME

(75) Inventors: Koichi Tsubaki, Kariya (JP); Yasuo Souki, Toyota (JP)

(73) Assignee: DENSO CORPORATION, Kariya (JP)

( * ) Notice: Subject to any disclaimer, the term of this patent is extended or adjusted under 35 U.S.C. 154(b) by 120 days.

(21) Appl. No.: 11/637,240

(22) Filed: Dec. 12, 2006

(65) Prior Publication Data

US 2007/0132045 A1    Jun. 14, 2007

(30) Foreign Application Priority Data

Dec. 12, 2005    (JP) ............................. 2005-357709

(51) Int. Cl.
   *H01L 21/00*    (2006.01)
(52) U.S. Cl. .................. 438/48; 438/49; 438/50; 438/51; 438/52; 438/53; 438/106; 438/108; 438/109; 257/414; 257/417; 257/E21.5; 257/E21.513
(58) Field of Classification Search .......... 438/48, 438/49, 50, 51, 52, 53, 106, 108, 109; 257/414, 257/417, E21.5, E21.513
See application file for complete search history.

(56) References Cited

U.S. PATENT DOCUMENTS

| 5,483,106 | A  | * | 1/1996  | Echigo et al. ............... 257/783 |
| 5,897,337 | A  | * | 4/1999  | Kata et al. ................... 438/114 |
| 6,133,637 | A  | * | 10/2000 | Hikita et al. ................. 257/777 |
| 6,255,741 | B1 |   | 7/2001  | Yoshihara et al. |
| 6,323,529 | B1 | * | 11/2001 | Nagahara ..................... 257/420 |
| 6,448,624 | B1 | * | 9/2002  | Ishio et al. .................. 257/417 |
| 6,810,736 | B2 |   | 11/2004 | Ikezawa et al. |
| 2001/0055836 | A1 | * | 12/2001 | Kunda ......................... 438/108 |

OTHER PUBLICATIONS

Office Action dated Jul. 1, 2008 in corresponding DE application No. 102006058325.6 (and English Translation).

* cited by examiner

*Primary Examiner*—Andy Huynh
(74) *Attorney, Agent, or Firm*—Posz Law Group, PLC

(57) ABSTRACT

A semiconductor sensor includes an adhesive film for suppressing thermal stress transfer to a semiconductor sensor chip. More specifically, the adhesive film includes a first layer and a second layer. An elasticity modulus of the first layer is lower than that of the second layer, and the second layer has a water absorption smaller than that of the first layer. One surface of a semiconductor wafer is in contact with the first layer. Once the semiconductor wafer and the adhesive film are diced into a plurality of sensor chips, the sensor chip with the adhesive film is mounted on a sensor package via the second layer interposed therebetween.

10 Claims, 3 Drawing Sheets

SEMICONDUCTOR DYNAMIC SENSOR AND METHOD OF MANUFACTURING THE SAME

CROSS REFERENCE TO RELATED APPLICATION

This application is based on and incorporates herein by reference Japanese Patent Application No. 2005-357709 filed on Dec. 12, 2005.

FIELD OF THE INVENTION

This invention relates generally to semiconductor devices, and more specifically to a semiconductor dynamic sensor mounted with a semiconductor sensor chip on a package through a two-layer adhesive film, and a method of manufacturing the same.

BACKGROUND OF THE INVENTION

Conventionally, a semiconductor type dynamic sensor such as, for example, that disclosed in U.S. Pat. No. 6,810,736B2 (JP-A-2003-270264), includes a sensor chip for outputting a signal based on a force applied thereto. The sensor chip is mounted on a sensor package with an adhesive film having a low elasticity modulus. Because of its low elasticity modulus, the film is capable of suppressing thermal stress from being transferred to the sensor chip from the package case.

This above described semiconductor type dynamic sensor is manufactured by dicing (or cutting) a semiconductor wafer to multiple sensor chips. An adhesive film is cut to a size corresponding to a size of each diced sensor chip. After the adhesive film is adhered to the sensor package, the sensor chip is mounted on the adhesive film.

While the adhesive film has a low elasticity modulus to suppress transfer of thermal stress to the sensor chip, such a low elasticity modulus film is highly absorbent. Therefore, when the adhesive film is adhered to the semiconductor wafer and the wafer is then diced into individual sensor chips, the adhesive film absorbs water used during the dicing process. As a result, the adhesive property and the elasticity modulus of the film deteriorate. In addition, the film is heated prior to being adhered to the semiconductor wafer to enhance its adhesion to the wafer. However, applying such heat to the adhesive film weakens the adhesive power of the adhesive film, therefore the adhesive power becomes insufficient while the film is mounted on the circuit chip.

In addition, because the wafer dicing process and the chip mounting process are performed separately, the sensor manufacturing process is complex and time consuming.

SUMMARY OF THE INVENTION

The present invention has been conceived in view of the background thus far described and its object is to provide an improved semiconductor sensor having an adhesive film for suppressing the transfer of thermal stress to a semiconductor sensor chip that is mounted on a sensor package with the adhesive film.

In a method according to a first aspect of the present invention, an adhesive film including a first layer and a second layer is provided. An elasticity modulus of a first layer of the film is lower than that of a second layer, and a water absorption of the second layer is smaller than that of the first layer. The adhesive film is adhered to one surface of a semiconductor wafer by its first layer. The semiconductor wafer including the adhesive film is diced into a plurality of sensor chips. Each of the sensor chips including the adhesive film is mounted on a package by adhering the second layer of the adhesive film to the package.

Because of its low elasticity modulus, the first layer of the adhesive film can suppress stress such as thermal stress or mechanical stress that would otherwise be transferred to the chip. The first layer is protected from water by the second layer during the dicing process. The semiconductor wafer can be diced to form a plurality of sensor chips with the adhesive film after the adhesive film is adhered to the wafer.

Preferably, the second layer has a water absorption equal to or less than 0.2% by weight of the film, and that the first layer has an elasticity modulus lower than 100 mega-Pascal (Mpa) to suppress the transmission of thermal stress.

In addition, the first layer thickness is larger than that of the second layer to reduce the influence of the second layer and to increase the elasticity effect of the first layer.

A semiconductor dynamic sensor according to a second aspect comprises an adhesive film interposed between a sensor chip and a circuit chip. The film includes both a first layer and a second layer. The first layer has an elasticity modulus that is less than that of the second layer. The second layer has a water absorption that is smaller than that of the first layer.

In this semiconductor dynamic sensor structure, the first layer of the adhesive film can suppress thermal stress while the second layer can absorb water that would otherwise compromise the adhesiveness and elasticity of the first layer during the dicing process.

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation.

DETAILED DESCRIPTION

Figure 1:
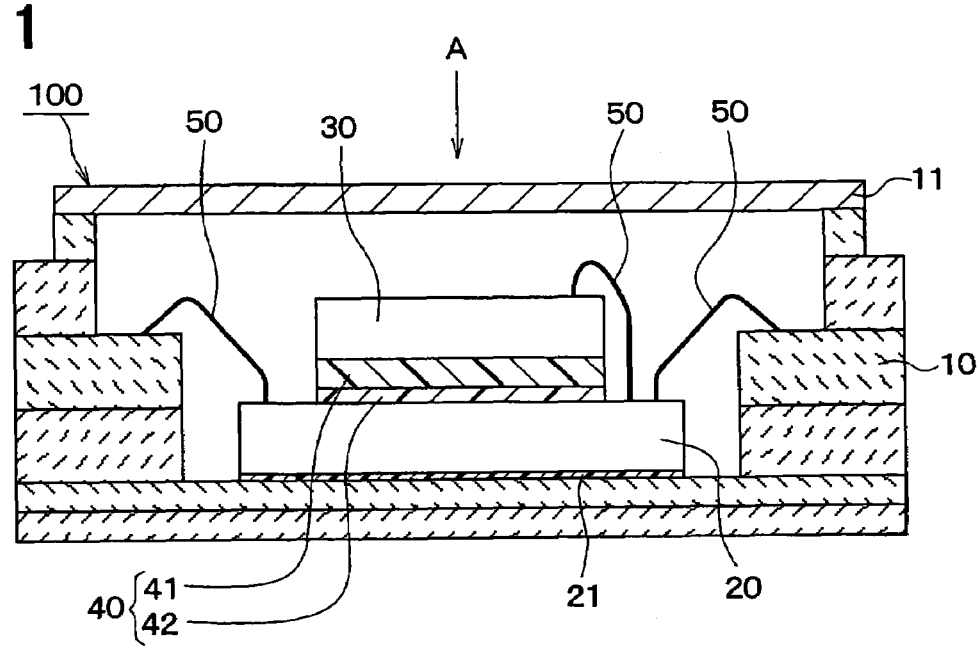
FIG. 1 is a schematic cross-sectional view showing an acceleration sensor of a first exemplary embodiment.

Exemplary embodiments of a semiconductor dynamic sensor and method for manufacturing will be described with reference to the appended claims and drawings, all of which form part of this application. In the drawings, identical portions or corresponding portions are identified with the same numerals to eliminate redundant explanation.

Figure 2:
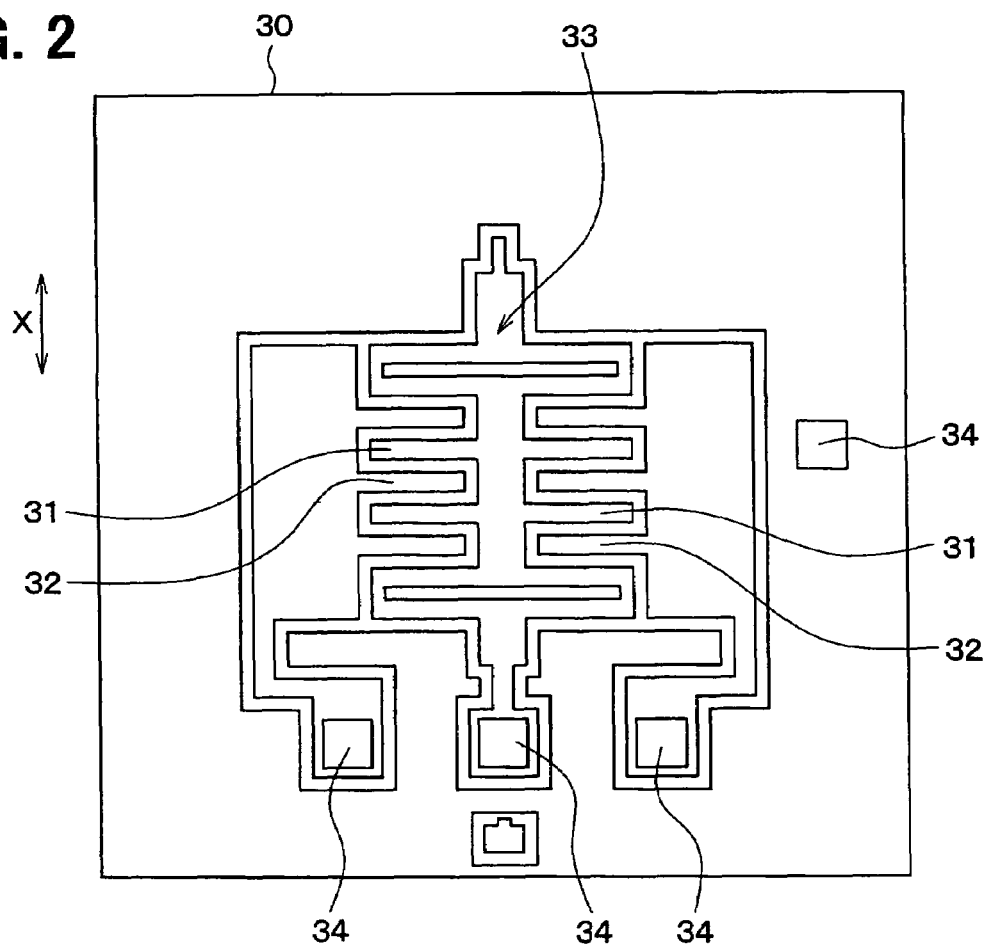
FIG. 2 is a plan view showing the acceleration sensor viewed from direction A shown in FIG. 1.

FIG. 1 is a schematic cross-sectional view showing an acceleration sensor device 100 of a first exemplary embodiment, and FIG. 2 is a plan view showing an acceleration sensor chip 30 in the acceleration sensor device 100 when the sensor is viewed from direction A shown in FIG. 1.

The acceleration sensor device 100 can be utilized as an acceleration sensor or a gyro sensor for use in an automotive vehicle, and to control devices such as an air bag, an Anti Lock Brake System (ABS), or a variable stabilizer control (VSC).

As shown in FIG. 1, the acceleration sensor device 100 includes a package 10, a circuit chip 20 mounted on the package 10, and a sensor chip 30 mounted on the circuit chip 20 with an adhesive film 40 interposed therebetween.

The package 10 houses the circuit chip 20 and the sensor chip 30 and forms the main body of the acceleration sensor device 100. The package 10 is attached to an object to be measured at an appropriate position. The package 10 is made of a material such as a ceramic or a resin, but is not limited to any particular material.

In this example, the package 10 is formed from a laminated substrate including a plurality of laminated ceramic layers such as alumina layers. Although not shown, wiring in the package 10 is formed within races formed in the surface of each ceramic layer to enable the acceleration sensor device 100 and external devices to be electrically connected.

The circuit chip 20 is mounted on a bottom surface of the package 10 and is adhered to the package 10 by an adhesive material 21 interposed therebetween. The adhesive material 21 is made of silicone resin. The circuit chip 20 has a detecting circuit for processing a signal output from the sensor chip 30, and includes MOS transistor elements formed on a semiconductor substrate by a conventional semiconductor process.

The sensor chip 30 is supported on the circuit chip 20 and is attached to the circuit chip 20 by an adhesive film 40 interposed therebetween. The circuit chip 20 and the sensor chip 30 are adhesively bonded together by the adhesive film 40.

As shown in FIG. 2, pads 34 made of a material such as aluminum are formed on the sensor chip 30. Although not shown, pads are also formed on the circuit chip 20 and wiring is formed on the package 10. The sensor chip 30 is electrically connected to the circuit chip 20 through bonding wires 50 connected between the pads 34 on the sensor chip 30 and the pads (not shown) on the circuit chip 20. The circuit chip 20 is electrically connected to the wiring on the package 10 through the bonding wires 50.

The sensor chip 30 is formed from a silicon-on-insulator (SOI) substrate including a first silicon substrate, an oxide film and a second silicon substrate. The sensor chip 30 includes a beam structure having movable electrodes and stationary electrodes. An electrostatic capacitance of the beam structure varies in accordance with an amount of acceleration imposed thereon. The amount of acceleration detected is based on changes in the electrostatic capacitance of the beam structure.

More specifically, as shown in FIG. 2, the beam structure is formed by movable electrodes 31 and stationary electrodes 32 configured in a comb-like shape. When an acceleration is imposed on the beam structure in the X-direction (shown in FIG. 2), the movable electrodes 31 are displaced in the X-direction. An electrostatic capacitance between the movable electrodes 31 and the stationary electrodes 32 changes in proportion to the amount of displacement of the movable electrodes 31. Signals representing the capacitance changes are fed to the circuit chip 20 through the bonding wires 50, and the circuit chip 20 outputs electrical signals such as voltage signals representing the detected amount of acceleration. The electrical outputs from the circuit chip 20 are led to the package 10 through the bonding wires 50 and outputted to an outside circuit through wiring (not shown) formed on the package 10.

As shown in FIG. 1, the adhesive film 40, which is adhesively mounted to a face that is opposite that on which the beam structure 33 in the sensor chip 30 is located, includes a first layer 41 having one surface adhered to a bottom face of the sensor chip 30 and a second layer 42 having one surface adhered to the top face of the circuit chip 20. Opposing surfaces of the first and second layers 41, 42 are adhered to one another. The first layer 41 is formed from a thermosetting material, such as a silicone-type resin material, and has a coefficient of elasticity that is lower than that of the second layer 42. The second layer 42 is formed from a thermosetting material, such as a polyimide resin, having a water absorption that is smaller than that of the first layer 41. More specifically, the first layer 41 has an elasticity modulus lower than 100 mega-Pascal (Mpa), and preferably 1-10 Mpa. The second layer 42 has a water absorption equal to or less than 0.2% by weight and is less absorbent than the first layer 41.

In the present embodiment, when heat is applied to the acceleration sensor device 100, because the thermal expansion coefficients of the package 10, the circuit chip 20 and the sensor chip 30 are different from one another, a thermal stress is transferred to the sensor chip 30 from the package 10 and the circuit chip 20. However, because the adhesive film 40 has a low elasticity modulus first layer 41, the thermal stress transferred to the sensor chip 30 from the circuit chip 20 is suppressed by the first layer 41. Therefore, a distortion of the sensing characteristics of the sensor chip 30 can be prevented.

The thickness of the second layer 42 is less than that of the first layer 41; therefore, the elasticity influence of the first layer 41 is increased and that of the second layer 42 is decreased.

Specifically, the thickness of the first layer 41 is preferably selected from a range of between 45 μm and 180 μm, and more specifically between 50 μm and 175 μm, and that of the second layer 42 is between 10 μm and 20 μm, and more specifically around 15 μm. In addition, as shown in FIG. 1, a cover 11 made of a material such as metal, resin or ceramic is attached to an aperture of the package 10 by welding or soldering. The inside of the package 10 is therefore sealed.

Next, referring to FIGS. 3A, 3B and 4, a process of manufacturing the acceleration sensor device 100 will be described.

Figure 3A:
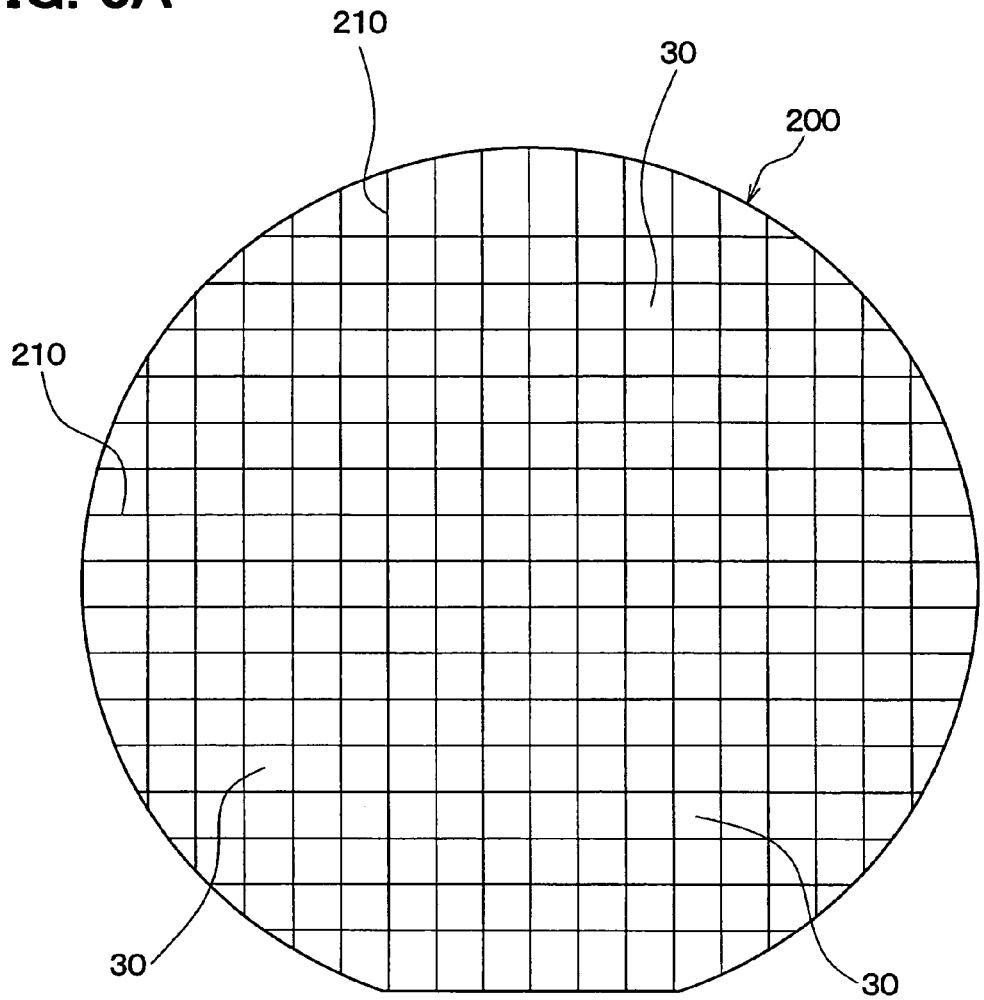
FIG. 3A is a top plan view showing a semiconductor wafer.

FIG. 3A is a view showing a semiconductor wafer 200 on which is formed a plurality of sensor chips 30, and to which is attached the adhesive film 40. FIG. 3A is a top plan view showing the semiconductor wafer 200, and FIG. 3B is a side elevation showing the semiconductor wafer 200. FIG. 4 is a schematic cross-sectional view showing when a dicing process cuts the semiconductor wafer 200 shown in FIGS. 3A and 3B into the individual plurality of chips.

The semiconductor wafer 200 includes a plurality of semiconductor sensor chips formed on an SOI semiconductor wafer using known semiconductor manufacturing processes, as well as a plurality of semiconductor sensor chips formed on the wafer individual chips. Each sensor chip 30 is sectioned by dicing lines such as those identified by lines 210 in FIG. 3A, along which the semiconductor wafer 200 is cut.

Figure 3B:
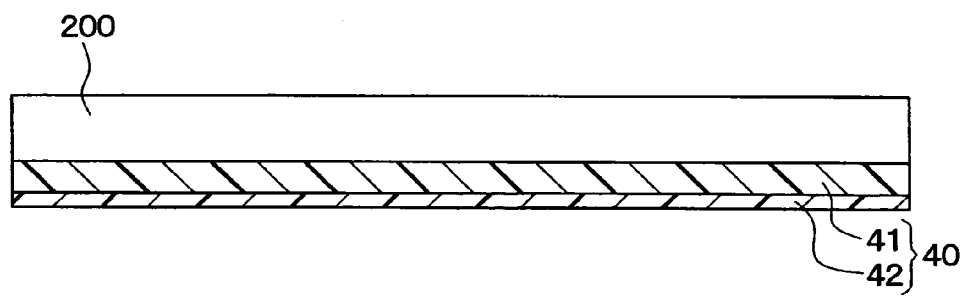
FIG. 3B is a side view of the wafer in FIG. 3A.

After the first layer 41 and the second layer 42 are prepared as the adhesive film 40, as shown FIG. 3B, the adhesive film 40 is stuck on, or adhered to, one side of the semiconductor wafer 200. In present embodiment, the first layer 41 is initially adhered to one side of semiconductor wafer 200 and the second layer 42 is adhered to the first layer 41.

Herein, initially the first layer 41 is stuck on the semiconductor wafer 200, and thereafter the second layer 42 is stuck on the first layer 41 using heat contact bonding at a temperature of about 150-250° C. and at a pressure of several seconds.

Alternatively, after the first layer 41 and the second layer 42 are adhered to one another, the unified film structure may be adhered initially to one side of semiconductor wafer 200 via the first layer 41.

For this case, the order in which the first and second layers 41, 42 are adhered is different from the above first example. However, conditions such as the temperature at which the first and second layers are stuck to one another and at which the second layer 42 is stuck to the semiconductor wafer 200 are approximately the same as an above example.

Figure 4:
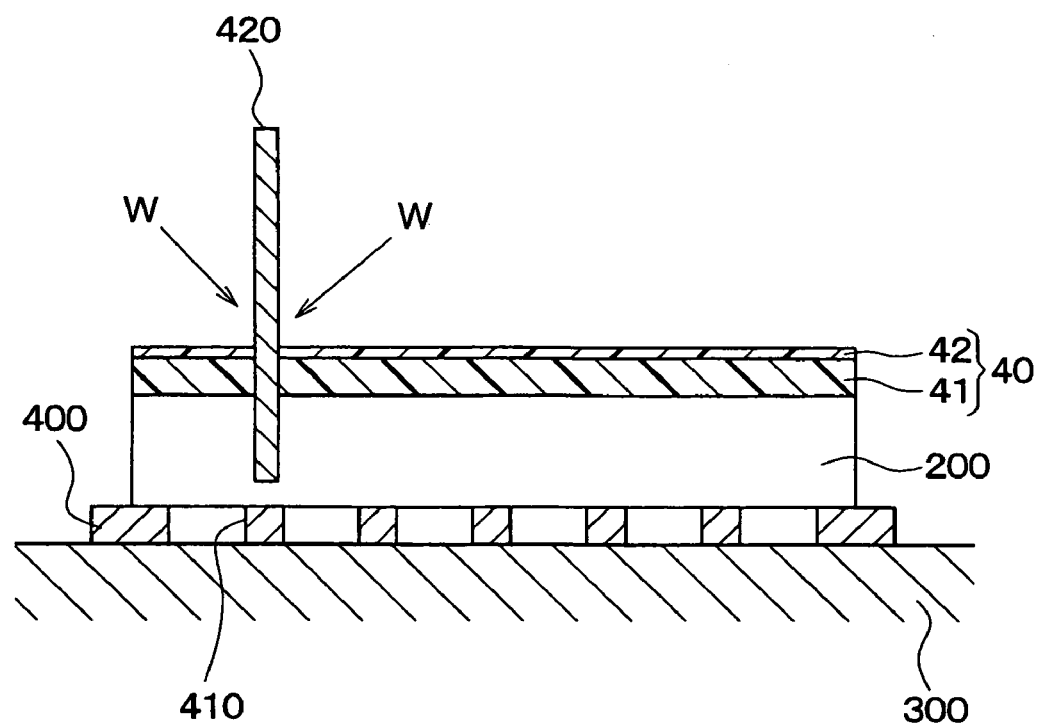
FIG. 4 is a schematic cross-sectional view of a step in the dicing process used to dice the semiconductor wafer shown in FIGS. 3A and 3B.

As shown FIG. 4, successively, the semiconductor wafer 200 including the adhesive film 40 is set up on a support 300. The adhesive film 40 is set up to the top surface to protect the sensing part of the sensor chip 30 such as the beam structure 33 (not shown). The dicing blade 420 cuts the surface of the adhesive film 40.

The semiconductor wafer 200 is set up on the support 300 with a mask 400 interposed. The mask 400 is made of a metal having a plurality of apertures (or open portions) corresponding to the lines 210 and the sensor chips 30 (as shown FIG. 3A).

As shown FIG. 4, as the dicing blade 420 cuts the semiconductor wafer 200 into chip units along with the adhesive film 40, cutwater W used in the dicing is applied to the surface of the adhesive film 40. The first layer 41 of the adhesive film 40 is protected by (covered with) the second layer 42 so that the first layer 41 does not absorb the cutwater W because the second layer 42 has a low water absorption. The semiconductor wafer 200 on which plural sensor chips are formed is separated into individual sensor chips with the adhesive film 40 by the dicing blade 420.

As shown FIG. 1, the circuit chip 20 is mounted on the base surface of the package 10 via the adhesive material 21 by pressing the circuit chip 20 onto the adhesive material 21 with a mounting jig and heating the adhesive material 21. The sensor chip 30 with the adhesive film 40 is mounted on the surface of the circuit chip 20 by pressing the second layer 42 to the circuit chip 20 for several seconds and using a mounting jig and heating the second layer 42 to a temperature of, for example, about 150-250° C. by placing the adhesive film 40 in an oven for several dozen minutes. Therefore, the sensor chip 30 is mounted on the circuit chip 20 in the package 10 via the second layer 42 of the adhesive film 40.

Next, the package 10, the circuit chip 20, and the sensor chip 30 are electrically connected by bonding wires 50 such as gold or aluminum. Finally, the package 10 is encased within the cover 11 by welding shut the opening edge of the package 10.

According to the above described embodiment, the adhesive film 40 is includes both the low elasticity modulus first layer 41 and the low water absorption second layer 42. The first layer 41 contacts the surface of the sensor chip 30 so that the first layer 41 is covered by the second layer 42. Therefore, the first layer 41 suppresses the transmission of thermal stress from the circuit chip 20 to the sensor chip 30 and is protected by the second layer 42 from the dicing water. Therefore, the adhesiveness and elasticity of the first layer 41 is not compromised by the dicing water. In addition, as discussed in connection with FIG. 4, the adhesive film 40 can suppress transmission of thermal stress from the circuit chip 20 to the sensor chip 30 and can be cut by a dicing blade when mounted on a semiconductor wafer, and can be simultaneously mounted along with the sensor chip on the circuit chip 20.

According to the present embodiment, the dicing cut process of the semiconductor wafer 200 and the cutting process of the adhesive film 40 is combined so that the number of process steps, and therefore overall manufacturing time, can be reduced.

In addition, the presently described manufacturing process overcomes the above described limitations related to the separate cutting process of the adhesive film by reducing film breakage due to cutting errors, and therefore reducing material cost of the film.

Other Embodiments

In the above described embodiment, the adhesive film 40 includes the first layer 41 formed from a first film that is affixed to the second layer 42 formed from a second film. Alternatively, the material of the first film layer may be modified to form the second layer.

In detail, the silicon-type resin film may be modified by heat treatment, ion irradiation, or ultraviolet irradiation on one side surface thereof. As a result, an outer layer surface of the adhesive film 40 is rigidified and forms the second layer 42, while the portion that does not stiffen forms the first layer 41.

In this alternative configuration, the first layer 41 has a lower elasticity than the second layer 42, and the water absorption of the second layer 42 is smaller than that of the first layer 41. The elasticity modulus of the first layer 41 is less than or equal to 100 MPa, and preferably 1-10 MPa, and the water absorption of the second layer 42 is less than or equal to 0.2% by weight.

In addition, in the embodiment shown in FIG. 1, the sensor chip 30 was adhered to the package 10 through the circuit chip 20. However, the sensor chip 30 may alternatively be mounted on the surface of the package 10 directly with the adhesive film 40 without the circuit chip 20.

The present invention is applicable not only to an acceleration sensor formed on an SOI semiconductor wafer but also to other dynamic sensors such as an angular velocity sensor.

In addition, the beam structure 33 including the movable electrode 31 used in the sensor chip 30 may be replaced with a piezoelectric element that generates electrical signals in response to a dynamic force applied thereto.

Finally, the package is not limited to the ceramic laminated substrate having a wiring described above.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor sensor including a package and a sensor chip mounted thereon and for outputting an electrical signal representing an amount of force applied thereto, the method comprising:
    providing an adhesive film comprising a first layer and a second layer, the first layer having a elasticity modulus that is lower than that of the second layer, the second layer having a water absorption smaller than that of the first layer;
    providing a semiconductor wafer on which a plurality of sensor chips are formed;
    adhering the first layer of the adhesive film to a first surface of the semiconductor wafer;
    dicing the semiconductor wafer to form the sensor chip on which the adhesive film is adhered; and
    mounting the sensor chip on the package via the second layer of the adhesive film, wherein the dicing of the semiconductor wafer to form the sensor chip is performed on a first surface side of the semiconductor wafer on which the adhesive film is adhered, and includes cutting the surface of the second layer of the adhesive film before cutting the first layer.

2. The method according to claim 1, wherein the providing the adhesive film comprises adhering a first film as the first layer to a second film as the second layer.

3. The method according to claim 1, wherein the providing the adhesive film comprises adhering a first film as the first layer to a second film as the second layer, the first film being initially adhered to a surface of semiconductor wafer and the second layer being adhered to the first film.

4. The method according to claim 1, wherein the providing the adhesive film comprises adhering a first film as the first layer to a second film as the second layer, and, after the first film and the second film are adhered to one another, adhering the unified film structure initially on one surface of semiconductor wafer.

5. The method according to claim 1, wherein the providing the adhesive film comprises modifying one surface of the adhesive film to form the second layer.

6. The method according to claim 1, wherein the second layer has the water absorption equal to or less than 0.2% by weight.

7. The method according to claim 1, wherein the first layer has an elasticity modulus lower than 100 mega-Pascal.

8. The method according to claim 1, wherein the first layer has a thickness larger than that of the second layer.

9. A method of manufacturing a semiconductor sensor including a package, a circuit chip, and a sensor chip, the sensor outputting an electrical signal representing an amount of force applied thereto, the method comprising:

providing an adhesive film comprising a first layer and a second layer, the first layer having a elasticity modulus lower than that of the second layer and the second layer having a water absorption smaller than that of the first layer;

providing a semiconductor wafer on which a plurality of sensor chips are formed;

adhering the first layer of the adhesive film to a side of the semiconductor wafer such that the adhesive film is adhered to the semiconductor wafer;

dicing the semiconductor wafer to form the sensor chip on which the adhesive film is adhered;

mounting the sensor chip onto the circuit chip by adhering a portion the second layer of the adhesive film on the sensor chip to the circuit chip;

and mounting the circuit chip, with the sensor chip mounted thereon, onto the package.

10. The method according to claim 9, wherein the dicing of the semiconductor wafer to form the sensor chip is performed on the side of the semiconductor wafer on which the adhesive film is adhered, and includes cutting the surface of the second layer of the adhesive film before cutting the first layer.

* * * * *